United States Patent [19]

Holtzman et al.

[11] Patent Number: 4,657,632
[45] Date of Patent: Apr. 14, 1987

[54] USE OF IMMERSION TIN COATING AS ETCH RESIST

[75] Inventors: Abraham M. Holtzman, Bat Yam; Joseph Relis, Ramat Gan, both of Israel

[73] Assignee: Techno Instruments Investments 1983 Ltd., Bat Yam, Israel

[21] Appl. No.: 808,879

[22] Filed: Dec. 13, 1985

Related U.S. Application Data

[63] Continuation-in-part of Ser. No. 770,842, Aug. 29, 1985.

[51] Int. Cl.[4] .............................................. B44C 1/22
[52] U.S. Cl. ..................... 156/659.1; 156/664; 156/901; 156/904; 427/96; 427/126.1; 427/309; 427/437
[58] Field of Search ..................... 156/659.1, 664, 901, 156/904; 427/96, 309, 126.1, 437

[56] References Cited

U.S. PATENT DOCUMENTS

| | | | |
|---|---|---|---|
| 3,303,029 | 2/1967 | Shipley | 106/1.25 |
| 4,574,031 | 3/1986 | Dorey et al. | 156/655 |
| 4,588,474 | 5/1986 | Gross | 156/659.1 |

OTHER PUBLICATIONS

Derwent Publication, Acc. No. 80-67141C/38, Russian Pat. No. 712-455, Jan. 30, 1980.

Primary Examiner—Lorenzo B. Hayes
Attorney, Agent, or Firm—Scully, Scott, Murphy & Presser

[57] ABSTRACT

A process is disclosed for manufacturing a circuit board having a metal layer in which a portion of the metal layer is removed by etching. A novel etch resist immersion tin composition is selectively applied to the metal layer to leave areas of coated and uncoated metal followed by etching the metal not coated with the resist. The immersion tin composition is applied as a substantially pore free coating at thicknesses of from about 0.08 to about 0.175 microns. The novel immersion tin composition contains a tin salt and both thiourea compounds and urea compounds.

26 Claims, No Drawings

USE OF IMMERSION TIN COATING AS ETCH RESIST

RELATION TO OTHER APPLICATION

This application is a continuation-in-part application of U.S. patent application Ser. No. 770,842; filed Aug. 29, 1985.

DESCRIPTION

1. Technical Field

The field of the invention is printed circuit boards and a method for improving the manufacture of such boards by employing an immersion coating. A novel etch resist immersion coating process is disclosed.

2. Prior Art

Etch resist immersion tin coatings are disclosed by Orio, et al., British Patent No. 2,072,709 and Shipley, et al., U.S. Pat. No. 3,303,029.

SUMMARY OF THE INVENTION

The present invention relates to a novel etch resist immersion coating process employing an etch resist composition comprising:
(a) a thiourea compound
(b) a urea compound
(c) a metal salt such as a tin salt and optionally
(d) a chelating agent
(e) a reducing agent and
(f) an acid The process is directed to the manufacture of a device having a metal layer in which a portion of the metal layer is removed by etching. The aforesaid etch resist composition is selectively applied to the metal layer, leaving areas of coated and uncoated metal followed by etching the metal not coated with the etch resist.

In another embodiment, the invention relates to a process for manufacturing an electrical device having a metal layer on a dielectric layer in which portions of the metal layer are removed by etching. The metal layer remaining after etching comprises electrical circuit means. The etch resist composition defined herein is coated onto the metal layer followed by etching the un-coated metal with an etchant to form circuit means on the dielectric layer.

DETAILED DESCRIPTION

The present invention relates to a novel immersion composition and its use in the manufacture of printed circuit boards. Printed circuit boards (PCB's) comprise a non-conducting or dielectric base made up of a fibrous material such as glass fibers, paper and the like, impregnated with a resinous material such as an epoxy or phenolic resin. The board is clad with a metal conductive layer such as copper on either one or both surfaces. Multilayer boards (MLB's) comprise several PCB's laminated to one another by means of an adhesive. In addition to rigid boards (as described above), flexible boards can be produced employing thermoplastic dielectric layers such as fluorocarbon polymers, Nylon polymers, polyimides, polyparabanic acids, and polyesters. Production of these types of printed circuit boards are described in *Printed Circuits Handbook*, Second Edition, edited by C. F. Coombs, Jr. McGraw-Hill, 1979, which is incorporated herein by reference. Laminated combinations of flexible and rigid boards are also finding utility in some more recent applications for MLB's. The present invention applies to all of these structures.

In the manufacture of PCB's, a metal conductive foil such as copper is bonded to the circuit board, although for the purposes of the present invention any metal may be applied to a non-conductive dielectric circuit board as a foil, by electro deposition or electroless depositions.

Prior to laminating PCB's to form an MLB, the metal surface is treated in an art known manner to produce electrically conductive lines (circuits) for the transfer of current between components of an electrical circuit, the components comprising by way of example, diodes, transistors, resistors, capacitors, and the like. The circuits may be formed either by a positive or a negative working photo resist, silkscreen resist, or hand painted resist process followed by etching and in some instances, electrodeposition of a metal or metals, all of which is known in the art.

The circuits of the PCB's (the inner layers of an MLB) are usually formed by a print and etch process in which a positive working photo resist is applied to the metal layer, a positive circuit image projected onto the resist, followed by a developing process to leave a positive resist pattern. The positive resist pattern can also be formed by a negative working photo resist through which a negative circuit image is projected. The board is then etched after which the positive resist is removed. The elements of the circuit obtained do not have to be electrically connected to one another. These circuits elements that are not connected are placed on the PCB for subsequent connection to other boards in the MLB array.

In forming MLB's by laminating, an adhesive in the form of a prepreg is inserted between the surfaces of the PCB's that are to be laminated after which the multilayers are further treated by applying heat and pressure to them. The prepreg generally comprises a woven or non-woven layer or layers of fibers such as glass, cellulose (e.g., paper), and the like, glass being preferred. The prepreg also is impregnated with a so-called "B-stage" resin such as an epoxy resin that has been partially cured. Art known equivalents of epoxy resins are also employed as adhesives such as acrylic resins (used with polyimide circuit boards) or polyester resins.

In laminating the individual circuit boards (PCB's) to form the MLB, the individual PCB's are assembled in an MLB array and are placed in a press that is heated to 175° C. held there for about 10-15 minutes to bring the MLB array up to temperature after which a pressure of 250-400 psi is applied. The MLB array is held at this temperature and pressure for approximately 45-50 minutes after which heating is stopped and the MLB thus formed allowed to cool for about 10-15 minutes while in the press. After this cooling period, the pressure is released and the MLB is removed from the press.

One of the difficulties encountered in the prior art manufacture of MLB's is the low bonding strength sometimes obtained between the prepreg and the metal surface of a circuit board in the array of boards that make up the MLB. These problems are especially prevalent when the metal layer comprises copper. The bonding between the copper clad board and the prepreg was improved by etching the copper with amonium persulfate; however, only slightly better bonding strengths were obtained. Some improved adhesion over the etching process was obtained by pumice spraying to micro-etch the copper surface or provide cavities in the copper surface to which the resin such as the epoxy resin of the prepreg could be bonded to. Other mechanical processes such as brushing similarly provided a mechanical alteration of the surface of the copper to improve the bond strength.

Even better bond strengths between the copper layer and the prepreg were obtained with a so-called black oxide coating in which the copper surface of a PCB was treated with a mixture of sodium hypochlorite and sodium hydroxide to produce a black copper oxide. Prior to the formation of the black oxide coating, the copper surface had to be prepared by brushing, rinsing, and etching either with amonium persulfate or a sulfuric acid - hydrogen peroxide mixture.

It was subsequently discovered that by lowering the sodium hypochlorite/sodium hydroxide bath temperature from 90°–95° C. to 60°–65° C. some economies could be realized in that less heat had to be supplied to the bath, but more importantly the process was easier to control. By employing temperatures of from about 60°–65° C. a bronze or brown colored copper oxide layer was produced on the surface of the copper and slightly better bond strengths were obtained.

In MLB's, the circuit of one board is connected to the circuit of one or more of the other boards in the multilayers. This is achieved by forming pads or circular areas of metal at a point or points on the conductive line or lines of the board. The pads may also be isolated from the conductive lines. The other board or boards that are to be connected are similarly provided with pads and in the laminating process the pads of the different boards are aligned over one another.

The MLB is then pressed and cured after which the pads of the MLB's are drilled. The diameter of the drill is considerably less than the diameter of the pad, the ratio of diameters between the pad and the drill being 2:1 or greater so that the overall structure comprises at a minimum a pad from one board aligned over a pad from another board with a hole passing through them. Since the hole in cross-section ideally presents a surface of alternating layers of the pads of the individual PCB's separated by the non-conductive base, an electrically conductive element has to be employed in the hole to form an electrical connection between the pads. This is done by a process known in the art as through hole plating (PTH).

PTH processes are also employed for connecting two metal conductive surfaces having a single non-conductive or dielectric board interposed between them for the formation of a PCB. Boards of this type and the formation of through holes in such boards are also within the scope of the present invention and are intended to be included within the broad definition of the MLB's as that term is used throughout the specification.

Before the PTH process can be undertaken in the MLB, any "smear" in the hole must be removed. Smearing is a difficulty encountered in the manufacture of MLB's whereby the drill bit employed to form the hole through the aligned pads in an MLB picks up resinous material and deposits this material on the wall of the hole. Since the wall of the hole contains alternating resinous material layers and metal layers, the surface of the metal layers that form part of the hole wall will be coated with the resinous material thereby preventing any metallic plating material applied to the surface of the hole wall from contacting the metal layers and forming an electrically conductive connection with it. It is believed that the resinous material such as a B-stage epoxy resin used in the prepreg comprises the principle material involved in the smearing of the hole. Smearing, therefore, renders the PTH process ineffective.

The problem of smearing is overcome by a process known in the art as "etch-back" in which a strong mineral acid such as sulfuric acid (optionally containing some hydrofluoric acid) is used to etch away the "smear" from the wall of the hole. Hydrofluoric acid is added to the sulfuric acid to remove any glass fibers from the circuit board that might be projecting into the hole. The glass fiber ends come from the glass fiber batting employed in the manufacture of the circuit boards or prepreg and are removed since they cause imperfections in the surface of the metallic coating applied by the PTH process.

The etch-back process requires very careful control in order to prevent excessive etching of the wall of the hole. The concentration and temperature of the etching solution has to be carefully monitored as well as the length of time over which the etching process is conducted.

Precise control of the degree of etch-back is critical in order to obtain an acceptable metal coating on the wall of the through hole. In some instances in the etch-back process, the etching solution will remove the resinous layer of the MLB to a greater degree than the metal or copper layers in the hole. This will result, after etching, in the metal layers projecting slightly beyond the wall of the hole as defined by the surface of the resinous material. If this metal layer projection is excessive, the metal coating applied to the wall of the hole by the PTH process will be uneven and will not make proper electrical contact with the metal layers in the hole.

The phenomenon of the metal layer being etched at a faster rate than the resinous layer in the hole is known as "reverse etch" which in some instances presents the same type of problem encountered where the metal layer projects too far into the hole after etching.

After smear is removed, the through hole is plated. Electroless copper is employed as a PTH plating material. Standard electroless copper plating solutions known in the art are used for this purpose. In order to promote the deposition of electroless copper on a non-conductive surface, the non-conductive surface is treated with a stannous chloride sensitizer solution followed by a super sensitizer solution of di-valent palladium chloride. The stannous chloride is oxidized to stannic chloride and the palladium chloride reduced to palladium metal. A preferred method is to employ an activator comprising colloidal palladium containing stannic tin. Stannic tin forms a protective colloid around the metallic palladium, and the solution implants a precious metal site on the non-conductive surface for the purpose of initiating the deposition of the copper by chemical reduction. A post activator is then employed, generally an acid, to solubilize the protective colloid and expose the precious metal, i.e. palladium. The subsequently applied electroless copper coating solution contains cupric ions and a reducing agent such as formaldehyde, which reduces the cupric ions in the solution to copper metal when in the presence of palladium. The copper metal plates out on the surface of the through hole, making electrical contact with the walls of the metal pads through which the hole is drilled. The electroless copper may have subsequent metal coatings applied to it by electrolytic means.

After the PTH process is completed, a circuit is formed on the outer layer of the MLB. Because the outer conductive metal layer of an MLB is formed as part of the PTH process, a print and etch procedure cannot be employed for forming circuits on this layer. The etching step would remove the plating applied in the through holes and would be self-defeating. For this reason, after the PTH process is completed, a negative circuit pattern is formed on the surface of the MLB by means of a negative working photo resist, followed by projecting a positive circuit image onto the resist and developing. This leaves a negative photo resist circuit pattern on the board with bare metal exposed corresponding to the area of the circuit. The negative resist pattern can also be obtained by a positive working photo resist through which a negative circuit image is projected. The bare metal corresponding to the circuit is then coated by electrolytic means with a second metal that acts as an etch-resist. Tin lead alloys are the most common material used in this respect. The etch resist coating also coats the metal surface applied to the through holes in the PTH process. The photo resist is then removed and the board is etched resulting in the formation of a circuit on the outer layer of the MLB having a tin lead coating on the circuit as well as on the walls of the through hole.

After the PTH coating process and circuit formation on the outer layer of an MLB is completed the board has to be treated by two additional processing steps if it is to be subjected to wave soldering. In wave soldering, the wire leads of components of the circuit, such as resistors, capacitors, transistors, diodes and the like are inserted into and through the through holes in the board so that the ends of the wire leads project out of the through holes at the outer layer of the board. The outer layer of the board is then continuously moved against a moving wave of molten solder thereby joining the lead ends to the pads that they project through. Since all metal surfaces on the bottom of the board (i.e., conductor lines in addition to pads and leads) come in contact with the molten solder wave in the wave soldering step, excessive amounts of solder would be applied to the board adding not only to its weight (which could be an adverse factor if the board is used in aircraft electronic systems) but also the cost. For this reason, a solder mask is placed over the outer layer of the board prior to the wave soldering process.

A solder mask comprises a photosensitive film (similar to the photoresist) which is exposed and developed to selectively remove areas of the film over those portions of the circuit to which solder is to be applied. The solder mask remains on the bottom layer of the board in the wave soldering operation and prevents the application of solder to areas of the circuit that do not require soldering.

One of the difficulties encountered with using the solder mask is that it is placed against the outer layer of an MLB on which the electrolytically deposited tin lead coating is employed as an etch resist. The tin lead etch resist flows at the soldering temperatures and bubbles are also formed under the mask under there conditions. This causes the mask to shift during the soldering process. As a result, the openings of the mask are no longer in registration with the areas of the circuit board to which solder has to be applied which results not only in circuit components not being soldered into the board but also short circuiting of various conductor lines on the board.

In order to overcome this problem, the electrolytically deposited tin lead etch resist coating is removed in a separate step prior to the application of the solder mask by reflowing it at elevated temperatures. Since the removal of the electrolytically deposited tin/lead coating is not always uniform (i.e., the tin/lead coating remains on the circuit at uneven thicknesses) the circuit board sometimes has to be subjected to a leveling process. This comprises passing the board over a hot air knife, i.e., a constricted elongated hot air jet. Thus, additional processing steps are required in order to overcome the problems with the solder mask shifting during the wave soldering operation.

The use of immersion tin coatings for plating metal surfaces does not employ an electric current but is based on an electro chemical displacement reaction. The metal substrate that is to be plated generally is more active (less noble) than the metal salt that is dissolved in the coating composition or plating solution. Copper may be plated by a tin solution even though copper is more noble than tin when the immersion coating composition is acidic and contains thiourea as a so-called "complexing" agent. It has been theorized that the relative electrode potentials of tin and copper are reversed under acidic conditions. Once the metal substrate is completely coated, it is no longer available to displace the metal ions in the immersion coating composition.

Some of the limitations of the immersion coating processes were the slow plating speeds, thickness of the coating, as well as the extensive degreasing, cleaning and oxide removal pre-coating steps that had to be employed.

The immersion coatings were also porous. The problems of porosity were attempted to be overcome by greater coating thicknesses. Additionally, high coating temperatures (about 82°–85° C.) had to be employed which in some instances caused noxious fumes to be produced from the coating solution and prevented the use of some low cost plastic materials of construction for the plating tank.

Coating times of from 10 to 40 minutes were not uncommon for this process. These times were employed in order to obtain nonporous, relatively thick films on the metal substrate. Additionally, the metal substrate such as a copper substrate employed in circuit boards had to be grease free and oxide free in order to obtain relatively thick tin coatings (Cf. Shneble, Jr., U.S. Pat. No. 3,917,486).

Immersion tin coatings have been applied in lieu of the tin lead electrolytic coating used as an etch resist. The immersion tin coatings of the prior art used in this respect are deposited at coating thicknesses of from about 40 millionths to about 80 millionths of an inch (Cf. Urio, et al. [supra], Shipley, et al. [supra] and Schneble, Jr. [supra]). It appears that these thicknesses are employed in order to obtain pinhole free etch resist coatings. Schnebel, Jr., supra (column 8, lines 22–28), observed that immersion tin coatings of 80 millionths of an inch used in combination with a solder mask flowed upon being contacted with molten solder in excess of 8 seconds and caused the solder mask to wrinkle.

Although tin may be used as an etch resist in the manufacture of printed circuit boards, the electrolytic and immersion tin coatings of the prior art are not entirely acceptable because under certain conditions they are subject to growth from their surfaces of metallic filaments described in the art as "whiskers." These metallic filaments are dendritic formations which in time and under conditions of high humidity and temperature or stress can grow to lengths of one quarter of an inch.

Circuit elements placed within one quarter of an inch from one another on high resolution printed circuit boards would be shorted out by whisker formation. (Cf., Davis, U.S. Pat. No. 4,194,913, column 3, lines 2–23).

Since whisker formation is in part due to the quantity of tin on the board, thin coatings of tin can be used to minimize or eliminate this problem. Prior art immersion tin coatings are generally unsatisfactory in this respect since they have to be deposited as relatively thick coatings (e.g., 40 to 80 millionths of an inch) to be good pore-free coatings.

It is, therefore, an object of the present invention to overcome these and other difficulties encountered in the prior art.

It is a further object of the invention to provide a method comprising selectively applying a novel immersion etch resist composition to a metal surface followed by etching the metal surface.

It is also an object of the invention to provide such method employing a relatively thin, pore free immersion composition.

It is a further object of the invention to provide such method employing a novel tin or tin alloy immersion composition.

It is a further object of the invention to provide such method for the formation of a circuit on an MLB circuit board.

It is a further object of the invention to provide such method for forming a sufficiently thin and pore free etch resist coating on an MLB so that the coating does not have to be removed or leveled before applying a solder mask over the coating.

It is a further object of the invention to provide such method for forming a tin or tin alloy immersion coating that eliminates or substantially minimizes "whisker" formation.

It is a further object of the present invention to provide a method for applying a novel metal immersion etch resist composition at room temperatures.

It is a further object of the present invention to provide a method for applying such an immersion etch resist composition as a coating material that will deposit a uniform, non-porous coating at a thickness of from about 0.08 to about 0.17 microns.

It is also an object of the invention to provide a method for applying such an etch resist composition that will form a coating in about 30 seconds.

These and other objects have been achieved according to the present invention which comprises an etch resist immersion coating process employing a composition, especially an immersion tin composition comprising:

| (1-a) | (a) a thiourea compound |
| | (b) a urea compound |
| | (c) a metal salt such as a tin salt |

The composition may optionally contain:

| (1-b) | (d) a chelating agent |
| | (e) a reducing agent and |
| | (f) an acid |

Preferred compositions comprise the formula (1-a) and especially those employing components (a) through (c) and (f) as listed above and those optionally containing (1-c) the salt of another metal (as noted herein) and (1-d) a surfactant.

The essential feature of the composition of the present invention is the use of the combination of a thiourea compound and a urea compound in an immersion coating. It has been found that when using this combination that bright, uniform, non-porous thin coatings especially coatings of tin or tin alloys can be applied to a metal substrate. Tin or tin alloy coatings from about 0.08 to about 0.17 microns are obtained that have good solderability and are good etch-resists because they are substantially non-porous.

The combination of the thiourea compound and urea compound allows coating of metal substrates with substantially no pre-cleaning or minimal pre-cleaning. The composition of the invention acts as a cleaning composition to some degree and in many instances can be applied directly onto a metal substrate without pre-cleaning.

By way of example, the immersion tin coating of the invention, optionally containing a nickel salt and a surfactant was applied to a copper surface that had a slight oil film, fingerprints and areas of copper oxide without any pre-cleaning of the copper surface or oxide removal. After about 15 seconds, a bright, well adhered tin nickel coating was obtained on the entire copper surface.

Thus the novel immersion coating comprising the combination of the thiourea composition and urea composition has been found to act as a cleaner and degreaser for the metal substrate over which the coating is applied. Extensive oil and/or grease removal and a scrubbing of the metal substrate to remove metal oxides is either substantially reduced or eliminated. The coating composition will also deposit on a metal oxide surface.

The immersion coatings such as the tin coatings of the invention have been similarly applied to gold and aluminum metal substrates and substantially the same results obtained. The application of the coating therefor appears to be independent of the reduction potentials of the metal substrates that are coated.

The components of the composition are present in the following amounts on a molar basis:

| (2-a) | (a) about 10 to about 125 parts of a thiourea compound |
| | (b) about 10 to about 125 parts of a urea compound |
| | (c) about 1 to about 15 parts of a metal salt such as a tin salt. | where the composition optionally contains a chelating agent, a reducing agent and an acid, these components are present in the following amounts on a molar basis:

| (2-b) | (d) about 5 to about 40 parts of a chelating agent |
| | (e) about 5 to about 110 parts of a reducing agent |
| | (f) about 1 to about 360 parts of an acid. |

The composition optionally may contain the salt of a second metal in the following amounts, on a molar basis:

| (2-c) | (g) about 0.2 to about 55 parts of a salt of a Group VIII metal, a Group IVA metal (with the exception of tin) a Group IIB metal and Group IB metal. It has also been found in this regard that as low as $2 \times 10^{-6}$ parts to about 55 parts and |

-continued

| | especially from about $2 \times 10^{-6}$ parts to about 5 parts of a metal salt of this type may also be used. |

A surfactant (2-d) may also be added to the composition in an amount as indicated herein. In one aspect of the invention a composition is provided comprising;

| (3-a) | Thiourea | 10–100 g/l |
|---|---|---|
| | Urea | 5–80 g/l |
| | Tartaric acid | 5–80 g/l |
| | Glucose | 5–80 g/l |
| | $H_2SO_4$ (36N, 98%) | 2–200 ml/l |
| | $SnSO_4$ | 1–30 g/l |

Similarly where a combination of tin and another metal is to be coated such as nickel the composition will have the following components added to it:

| (3-b) | Triton X-100 | 0.5–10 ml/l |
|---|---|---|
| | $NiSO_4$ | 5–80 g/l |

In one embodiment, a coating composition is prepared comprising the following:

| (4) | Thiourea | 60 g/l |
|---|---|---|
| | Urea | 40 g/l |
| | Tartaric Acid | 40 g/l |
| | Glucose | 40 g/l |
| | $H_2SO_4$ (36N; 98%) | 30–100 ml/l |
| | $SnSO_4$ | 20 g/l |
| | Triton X-100[1] (optional) | 5 ml/l |
| | $NiSO_4$ (optional) | 40 g/l |
| | Water | balance |

[1] non-ionic polyoxyethylene nonyl phenol surfactant.

Coating compositions containing about 60 g/l thiourea; about 40 g/l urea; about 40 g/l $SnSO_4$ and the balance water have been prepared and can form immersion tin coatings on a copper substrate.

The various equivalents as set forth herein for the foregoing components of formulas (1-a) through (1-d); (2-a) through (2-d); (3-a) and (3-b); and (4); and as known in the art may be substituted for such components on an equimolar basis.

Various combinations of tin and other metals may be used in the composition as soluble salts e.g. water soluble salts based on mineral acid or organic acid salts of these metals. The metals that may be used with tin include the soluble, e.g., water soluble salts of a metal taken from Group VIII, Group IB, Group IIB and Group IVA (with the exception of tin) of The Periodic Table of the Elements and mixtures thereof. Thus, in addition to tin nickel, tin lead or tin mercury coatings, may be deposited by means of the immersion composition and in accord with the method of the invention.

Tin-mercury coatings are especially suitable as an etch resist. The mercury is preferably employed as a salt comprising mercury chloride, e.g., $Hg_2Cl_2$ dissolved in any acid, but especially a mineral acid such as nitric acid and used in the composition in the amounts previously set forth in formula (2-a) and especially a broad range of mercury salts viz. anywhere from about $2 \times 10^{-6}$ parts to about 55 parts on a molar basis or from about $2 \times 10^{-6}$ to about 5 parts on a molar basis.

The mercury salts such as mercury chloride, e.g., $Hg_2Cl_2$ may be used in amounts of from about 10 ppm to about 20 g/l in formulas 3-a and 3-b as a substitute for $NiSO_4$, and especially about 1 to about 2 g/l of $Hg_2Cl_2$ dissolved in from about 1 to about 200 ml/l of 70% $HNO_3$ and especially from about 10 ml/l to about 20 ml/l of 70% $HNO_3$. The molar amounts of nitric acid that may be used in this respect comprise from about 1 to about 300 moles and especially from about 10 to about 30 moles when the components of the composition are employed according to formulas (2-a), (2-b) and (2-c). Tartaric acid and glucose are not employed (i.e., the chelating and reducing agent) and the concentration of $H_2SO_4$ (36N; 98%) is from about 100 ml/l to about 400 ml/l especially from about 150 ml/l to about 250 ml/l. Coatings employing the other Group IIB and Group IVA elements (with the exception of tin) may be similarly prepared by substituting the salts of these elements for the salts of mercury in the foregoing description and substantially the same results obtained. Salts of germanium and lead are especially suitable as substitutes for the mercury salts. Mixtures of Group IIB and IVA salts may also be used in this respect.

When the mercury salt or the salts substituted for mercury are employed it is preferred that they are first dissolved in an oxidizing acid such as nitric acid as noted herein. Various chelating agents may be used as well in this respect either with the oxidizing acid or especially in lieu of the oxidizing acid. Chelating agents such as citric acid and/or the other equivalent hydroxy carboxylic acids as described herein may be used or those chelating agents in addition to the hydroxy carboxylic acids as described herein may be used as well as mixtures thereof. The chelating agents in this regard are employed in the same quantitities as the oxidizing acid, i.e., the nitric acid in which the mercury salt is dissolved, and this amount of chelating agent is employed instead of the amounts set forth in formulas (2-b) and (3-a). Other oxidizing acids known in the art may be used in lieu of nitric acid in the amounts stated above for the dissolution of $Hg_2Cl_2$ in nitric acid.

Additionally, other immersion compositions, useful for plating metal surfaces are prepared by substituting other soluble, e.g., water soluble metal salts for tin of formulas (1-a) through (1-d); (2-a) through (2-d); (3-a) and (3-b); and (4), these other metal salts comprising those based on the metals of Group IVA; VB; VIB; VIIB; IB; IIB and IIIA of the Periodic Table of the Elements; the group IVA, VIII, IB, IIB and IIIA metals being preferred; and the Group IVA, VIII and IB metals being especially preferred. As referred to in the immediately preceding description, the Group IVA metals are intended to include the Group IVA metals with the exception of tin. The anions of these metal salts are the same as those defined herein for the tin salts. Additionally, the metal salts as defined above and herein are preferably employed in their lowest oxidation states, e.g., Sn(II); Ni(II); Hg(I); Au(I) and the like. In one embodiment it is preferred to employ tin in its lowest oxidation state whereas any of the other metallic salts may be employed in any oxidation state. Various mixtures of these other metal salts may also be employed. Salts of germanium, lead, mercury, silver, indium, gold and palladium are especially suitable.

Water soluble polymers may also be employed in the coating compositions of the foregoing formulas in an amount from about 0.5 g/l to about 500 g/l and especially from about 0.5 g/l to about 200 g/l. The water soluble polymers that may be employed in this respect comprise synthetic or natural polymers that are generally solid or near solid at room temperature (about 20° C.) are soluble in water under the conditions the coating composition is used and are stable in an acid environment, i.e., a pH of about 1 to about 6.8. Stability in this regard is the resistance of the polymer to decompose and/or discolor under the conditions of use. Conditions of use include both the use in the composition and when the composition is applied to form a coating on a metal surface to form an etch resist. An acrylic resin, acrysol WS-24, (trademark), sold by Rohm and Haas is especially suitable in this respect and comprises a polymer of acrylic acid. Other water soluble acrylic polymers may be employed including the copolymers of acrylic acid and methacrylic acid and the mono lower alkyl esters thereof, e.g., methacrylic acid—butyl acrylate copolymers. Polymers of methacrylic acid and partial lower alkyl esters thereof or of acrylic acid may also be employed. The acrylic polymers that are employed typically have molecular weights from about 2000 to about $4 \times 10^6$ and are commercial products well known in the art. All of the foregoing acrylic resins will be referred to herein as acrylic polymers.

Other water soluble resins that may be employed comprise the poly(vinyl alcohols) or copolymers of poly(vinyl alcohol) and vinyl acetate; polyacrylamides, including both the nonionic, cationic and anionic types, the nonionic and cationic being especially preferred, some of which are sold under the trademark of "Seperan" (Dow Chemical Co.), e.g., Separan NP10, AP273, MGL, MG200, MG500, PEG, CP-7 and 87D; polyethylene oxide resins having a molecular weight of from about $10 \times 10^5$ to about $5 \times 10^6$ provided that the cloud point of the polymer in water does not adversely affect the coating properties of the composition which will vary with the components of the composition; poly(N-vinyl-2-pyrrolidinone) homopolymers and copolymers with vinyl acetate having a molecular weight from about 2500 to about $6.3 \times 10^5$ and sold under the trademark "Kollidon" (homopolymer) and "Luviskol" (copolymer) by BASF, the homopolymer being preferred because of its increased water solubility; vinyl ether polymers such as the homopolymers of alkylvinyl ethers, vinyl ether-maleic anhydride copolymers, especially methylvinyl ether-maleic anhydride copolymers sold under the trademark "Gantrez" by GAF; styrene-maleic anhydride copolymers having a molecular weight of from about 1000 to about 50,000; ethylene maleic anhydride copolymers having a molecular weight of from about $8 \times 10^3$ to about $1 \times 10^5$; phenol formaldehyde resins such as resols (base catalyzed one-step) water soluble resins and their precursors such as dimethylol phenol and the like; amino resins and plastics such as condensation products of formaldehyde with urea, melamine, benzoguanamine, acetoguanamine, aniline, toluenesulfonamide, acrylamide and the like, the methylol condensation products of these amines being especially suitable because of their solubility in water; specific amine resins include urea formaldehyde, melamineformaldehyde, methylolurea, dimethylolurea, mono-, di-, and trimethylolmelamine, alkylated urea formaldehyde resins including alkylated methylol and dimethylolurea (where the alkyl group is a lower alkyl, i.e., from 1 to about 4 carbons), alkylated melamine formaldehyde resins as well as alkylated mono-, di- and trimethylol melamines where the alkyl group is the same as defined for the alkylated urea formaldehyde resins; ethyleneurea; propyleneurea, triazone; uron resins, i.e., mixtures of melamine resins, N,N'-bis(methoxymethyl)uron and methylated urea formaldehyde resin; glyoxal resins commonly referred to as resins of dimethyloldihydroxyethyleneurea; methylol carbamates; methylol derivatives of acrylamine, hydantoin and dicyandiamide; natural polymers such as the vegetable gums including agar, carragenan, corn starch, guar gam, gum arabic, gum karaya, gum tragacanth, locust bean gum; starches derived form potatoes, wheat and rice; tapioca; hydroxyalkyl starch; hydroxy ethyl cellulose; hydroxy propyl cellulose; methyl cellulose; xanthan gum; pectin; casein (milk protein) and the like. All of the foregoing are standard items of commerce and are readily available. Mixtures of these water soluble polymers may also be used.

When the water soluble polymer is employed in formula (2-a) and or (2-b) or (2-c) it will be added in an amount such that when the components of these formulas are made up into a solution, the final concentration of the water soluble polymer in the solution used as an immersion coating will be within the foregoing ranges, i.e., about 0.5 g/l to about 500 g/l and especially about 0.5 g/l to about 200 g/l.

The foregoing immersion coatings especially the tin coatings provide many advantages over the coatings employed in the prior art especially the tin immersion coatings of the prior art. Thinner pore free coatings are obtained, i.e., coatings of about 0.08 to about 0.175 microns compared to the prior art in which 1–2 micron coatings (40–80 millionths of an inch) are utilized to obtain pore free coatings.

The composition of the present invention will produce coatings of from about 0.001 to about 0.175 microns and especially from about 0.05 to about 0.175 microns. The coating times will vary from any where between about 2 seconds up to 5 minutes (especially 5 seconds to about 120 seconds), suitable coatings (about 0.065 microns) being obtained at about 30 seconds. The coating temperatures may vary any where from about 0° to about 30° C., especially from about 15° to about 25° C. although higher temperatures may also be employed.

The thiourea compounds and urea compounds of the present invention may be represented by the formula:

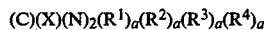

where
R$^1$=
(1) H
(2) alkyl or alkenyl having up to about 6 carbon atoms
(3) aryl, aralkyl, or alkaryl having up to about 12 carbon atoms
(4) cycloalkyl, cycloalkylalkyl, or alkylcycloalkyl having up to about 12 carbon atoms
(5) R$^5$ (CO) where R$^5$ may be the same as radicals (2) through (4) as defined above for R$^1$
(6) CH$_2$OH
(7) (C)(X)(N)$_2$(R$^1$)$_a$(R$^2$)$_a$(CO)$_2$
(8) (C)(X)(N)$_2$R$^1$R$^2$R$^3$
(9) (C)(X)(N) R$^1$R$^2$
(10) (C)(X)(N)$_2$R$^1$R$^2$ (CO)
R$^2$, R$^3$ and R$^4$ may be the same as radicals (1) through (6) as defined above for R$^1$.
a=1 or 0
For the thiourea compounds and their analogs employed according to the present invention X=S, Se or Te; X preferably is S.

For the urea compounds employed according to the present invention, X=oxygen.

Mineral and organic acid salts of the thiourea and urea compounds may also be used.

The thiourea compound of the present invention comprises either thiourea or the various art known derivatives, homologs, or analogs thereof. Compounds that may be employed in this respect comprise 2,4-dithiobiuret; 2,4,6-trithiotriuret; alkoxy ethers of isothiourea; thiocyanuric acid (trimer of thiourea); thioammelide (trimer of thiourea); monalkyl or dialkyl thiourea, where the alkyl group comprises a lower alkyl group, having up to about four carbon atoms such as diethyl thiourea or monoethyl thiourea; saturated or unsaturated cyclic hydrocarbons mono- or disubstituted thioureas such as naphthyl thiourea, diphenyl thiourea, cyclohexyl thiourea and the like, where the cyclic hydrocarbons has up to about ten carbon atoms; the disulfide of thiourea; thio-imidol (the reaction product of thiourea and sodium hydroxide); thiocarbamic acid esters (the reaction products of thiourea and an alcohol comprising ROH where R is a saturated or unsaturated aliphatic or cyclic group having up to about ten carbon atoms) the oligomers of thiourea and formaldehyde, e.g., monomethylol, dimethylol, and trimethylol thioureas; S-alkyl pseudo thioureas (manufactured by the reaction of thiourea with an iodo lower alkane such as iodo methane where the lower alkyl group contains up to about five carbon atoms); thiocarbonic acid esters of thiourea and $R^5OH$, ($R^5$ as defined above) especially where $R^5$ is lower alkyl; thioureadioxide (aka formamidinesulfinic acid [1758-73-2, C.A. Reg. No.]); the reaction product of a saturated or unsaturated aliphatic or cyclic organic acid having up to about 12 carbon atoms and especially the lower aliphatic monocarboxylic acid reaction products with thiourea e.g. acylthioureas, and the mineral acid salts of thiourea e.g. thiourea mono- or di-sulfate.

Similarly, the urea compound comprises either urea or the various substituted ureas or urea reaction products such as biuret; monoalkyl or dialkyl urea, where the alkyl group comprises a lower alkyl group having up to about four carbon atoms such as diethyl urea or monoethyl urea; saturated or unsaturated cyclic hydrocarbon mono- or disubstituted ureas where the cyclic hydrocarbon has up to ten carbon atoms, such as naphthyl urea, diphenyl urea, cyclohexyl urea and the like; alkoxy ethers of iso-urea especially lower alkoxy ethers of iso-urea where the lower alkyl group contains up to about five carbon atoms, these products being manufactured by the reaction of a lower alkanol with cyanamide hydrochloride; acid derivatives of urea in which the hydrogen atom of urea is substituted by an acyl group, these compounds sometimes being referred to as ureides obtained by the reaction of urea with a monocarboxylic aliphatic saturated or unsaturated organic acid having to about 20 carbon atoms and especially those acids having up to about four carbon atoms; the mineral acid salts of urea, e.g., urea mono- or disulfate; triuret; cyanuric acid (a trimer of urea); ammelide (a trimer of urea); imidol; carbamic acid esters of urea and $R^5OH$, (where $R^5$ is defined above) especially alkyl carbamates made by the reaction product of an organic alcohol with urea especially an alkanol such as a lower alkanol containing up to about four carbon atoms; monomethylol urea, dimethylol urea, trimethylol urea and other oligomers of urea and formaldehyde. The various substituted ureas and their use in immersion coatings is further disclosed by Ceresa, et al., in U.S. Pat. No. 2,891,871 which is incorporated herein by reference.

Other urea and thiourea compounds that may be employed comprise:
urea nitrate;
urea oxalate;
urea phosphate;
urea sulfate;
1-acetylurea;
1-acetyl-3-methylurea;
1-acetyl-2-thiourea;
S-acetyl-2-thiourea hydrochloride;
1-allylurea;
1-allyl-3-phenylurea;
1-allyl-2-thiourea;
1-(4-aminobenzenesulfonyl)urea;
1-(4-aminobenzenesulfonyl)-2-thiourea;
1-benzoylurea;
1-benzoyl-2-thiourea;
1-benzylurea;
1-benzyl-2-thiourea;
1,3-bis(2-ethoxyphenyl)urea;
1,3-bis(4-ethoxyphenyl)urea;
1,3-bis(2-4-dinitrophenyl)urea;
1-3-bis-(hydroxymethyl)urea;
1,3-bis(1-hydroxy-2,2,2-trichloroethyl)urea;
1(2-bromo-2-ethylbutanoyl)urea;
1(2-bromo-3-methylbutanoyl)urea;
1(2-bromophenyl)urea;
1(3-bromophenyl)urea;
1(4-bromophenyl)urea;
1-butylurea;
1-sec-butylurea;
1-tert-butylurea;
1-butyl-3-phenyl-2-thiourea;
1(2-chlorophenyl)urea;
3(4-chlorophenyl)-1,1-dimethylurea;
1(2-chlorophenyl)-2-thiourea;
1(4-chlorophenyl)-2-thiourea;
1,3-diacetylurea;
1,1-diethylurea;
1,3-diethylurea;
1,3-diethyl-1,3-diphenylurea;
1,3-diethyl-1,3-diphenyl-2-thiourea;
1,3-diethyl-2-thiourea;
1,1-dimethylurea;
1,3-dimethylurea;
1,3-dimethyl-1,3-diphenylurea;
1,3-dimethyl-2-thiourea;
1,1-di(2-naphthyl)urea;
1,3-di(1-naphthyl)urea;
1,3-di(2-naphthyl)urea;
1,3-di(1-naphthyl)-2-thiourea;
1,3-di(2-naphthyl)-2-thiourea;
1,1-diphenylurea;
1,3-diphenylurea;
1,3-diphenyl-1-methylurea;
1,3-diphenyl-S-methyl-2-thiourea;
1,1-diphenyl-2-thiourea;
1,3-diphenyl-2-thiourea;
1,1-dipropyl-2-thiourea;
1,3-dipropyl-2-thiourea;
1,3-diisopropyl-2-thiourea;
1,3-di(2-tolyl)-2-thiourea;
1,3-di(4-tolyl)-2-thiourea;
1(3-ethoxyphenyl)urea;
1(4-ethoxyphenyl)urea;
1-ethylurea;

1-ethyl-1-phenylurea;
1-ethyl-3-phenylurea;
1-ethyl-3-phenyl-2-thiourea;
1-ethyl-2-selenourea;
1-ethyl-2-tellurourea;
1-ethylidene-2-thiourea;
1-hydroxyurea;
1(hydroxymethyl)urea;
1(2-iodo-3-methylbutanoyl)urea;
isobutylurea;
1(2-isopropyl-4-pentenoyl)urea;
1(4-methoxy-phenyl)urea;
1-methylurea;
1(2-methyl-2-butyl)urea;
1(3-methyl-butyl)urea;
1-methyl-3(1-naphthyl)-2-thiourea;
1-methyl-1-nitrosourea;
1-methyl-3-phenyl-2-thiourea;
S-methyl-2-thiourea;
S- methylisothiouronium iodide;
S- methylisothiouronium nitrate;
S- methylisothiouronium sulfate;
1-methyl-2-thiourea;
1(1-naphthyl)urea;
1(2-naphthyl)urea;
1(1-naphthyl)-3-phenyl-2-thiourea;
1(1-naphthyl)-2-thiourea;
1(2-naphthyl)-2-thiourea;
1-nitrourea;
1-oxalylurea;
1(2-phenoxy-ethyl)urea;
1-phenylurea;
1(phenyl-acetyl)urea;
1-phenyl-2-thiourea;
S-phenyl-2-thiourea;
1-propylurea;
2-selenourea;
2-tellurourea;
1(sulfonamylphenyl)urea;
1,1,3,3-tetraethylurea;
1,1,3,3-tetramethylurea;
1,1,3,3-tetramethyl-2-thiourea;
1,1,3,3-tetraphenylurea;
1,1,3,3-tetraphenyl-2-thiourea;
2-thio-1(2-tolyl)urea;
2-thio-1(3-tolyl)urea;
2-thio-1(4-tolyl)urea;
2-thio-1,1,3-trimethylurea;
2-thio-1,1,3-triphenylurea;
1(2-tolyl)urea;
1(3-tolyl)urea;
1(4-tolyl)urea;
1,1,3-trimethylurea;

Some especially preferred thiourea compounds in addition to thiourea that may be employed according to the invention comprise:
phenylthiourea;
naphthylthiourea;
thiourea disulfide;
oligomers of thiourea and formaldehyde;
N-allylthiourea;
N-mono-p-tolylthiourea (and the equivalents thereof disclosed in U.S. Pat. No. 4,502,927, incorporated herein by reference);
N-alkylthioureas such as methylthiourea (and the equivalents thereof disclosed in West German Patent No. 3,110,478, incorporated herein by reference);
monophenylthiourea;
metaphenylenedithiourea;
N,N'-ethylenethiourea;
N,N'-dibutyneylthiourea;
N,N'-dibutenylthiourea;
trifluoro acetylthiourea;
isothiourea-S-propionic acid;
amino substituted thioureas such as thio semicarbazide and 1-phenylthiosemicarbazide;
1-aryl-thioureas where the aryl group is phenyl, benzyl or napthyl.

When substituted urea and thiourea compounds are employed in lieu of urea and thiourea it is preferred that each contain the same substituent. By way of example, if diethylthiourea is used in the composition in lieu of thiourea, diethylurea would be substituted for urea and so fourth.

The tin salt of the composition preferably comprises a stannous salt. Stannous salts of an inorganic (mineral) acid or organic acid may be used according to the invention (e.g., stannous formate, stannous acetate and the like). For example, the tin salt of the present invention may comprise a stannous salt of a mineral acid such as the sulfur, phosphorous, and halogen acids, (including fluoroboric acid) especially the sulfur acids such as sulfuric acid or sulfamic acid. Alkali metal stannates may also be used such as sodium or potassium stannate and the art known equivalents thereof. In one embodiment of the invention stannous sulfate, stannous sulfamate, stannous acetate or stannous fluoroborate is used as the tin salt. Coatings employing stannous fluoroborate as the tin salt are especially suitable in applications where mineral and/or organic acids are not added to the composition. Where tin lead coatings are deposited, lead acetate may be used as the lead salt. Mercury chloride such as $Hg_2Cl_2$ may be used as the mercury salt where tin mercury coatings are applied.

The acids that are employed according to the invention may be organic acids or inorganic acids (mineral acids) based on sulfur, phosphorous, nitrogen or the halogens, the sulfur based mineral acids being preferred such as sulfuric acid or sulfamic acid. Solid acids may be used in this respect such as an alkali metal bisulfate, e.g., sodium bisulfate and the art known equivalents thereof. Fluoroboric acid may be used as one of the halogen acids in addition to acids based on hydrogen chloride, hydrogen fluoride, hydrogen bromide and hydrogen iodide. Some of the organic acids that may be employed according to the invention comprise monocarboxylic or dicarboxylic acids having up to about six carbon atoms such as formic acid, acetic acid, malic acid, maleic acid, and the like.

It is preferred, if possible not to use halogen acids or halogen salts in the manufacture of electrical devices since halide residues will be produced in the metal coating deposited, these salts interfering with the electrical properties of the metal and may also act as corrosive materials in the coating.

In one embodiment, the acid is employed to maintain an acid pH which prevents or minimizes any oxidation reactions whereby the tin salt which is preferably a stannous salt could be oxidized to its higher valent form, i.e., a stannic salt.

The coating compositions may be applied by immersing the metal to be coated in a bath comprising the composition, by spraying, roller application and the like. It is preferred to use acids in the composition or the stannous fluoroborate composition for spraying, especially at the higher concentrations of acid such as about 300 to about 360 parts of acid in formula (2-b) or about 150 ml/l to about 200 ml/l in formula (3-a) as well as in the equivalents of formula (3-a) as described herein.

The chelating agents that may be employed generally comprise the various classes of chelating agents and specific compounds disclosed in Kirk-Othmer, *Encyclopedia of Chemical Technology*, Third Edition, Volume 5, pages 339–368, incorporated herein by reference. Chelating agents that are especially preferred comprise the aminocarboxylic acids and the hydroxycarboxylic acids. Some specific aminocarboxylic acids that may be employed in this respect comprise ethylenediaminetetraacetic acid, hydroxyethylethylenediaminetriacetic acid, nitrilotriacetic acid, N-dihydroxyethylglycine, and ethylenebis(hydroxyphenylglycine). Hydroxy carboxylic acids that may be employed comprise tartaric acid, citric acid, gluconic acid and 5-sulfosalicylic acid.

The various reducing agents that may be employed according to the present invention are well known in the art and generally comprise organic aldehydes whether saturated or unsaturated, aliphatic or cyclic, having up to about ten carbon atoms. Lower alkyl aldehydes having up to about six carbon atoms may be employed in this respect such as formaldehyde, acetaldehyde, propionaldehyde, butyraldehyde, and the like. Especially preferred aldehydes comprise hydroxy aliphatic aldehydes such as glyceraldehyde; erythrose; threose; arabinose and the various position isomers thereof and glucose and the various position isomers thereof. Glucose has been found to act to prevent oxidation of the metal salts to a higher oxidation state (e.g., SnII to SnIV), but also as a chelating agent and is especially useful for these reasons. Hydrazine or sodium hypophosphite may also be employed as reducing agents along with the art known equivalents thereof as well as various multivalent cations that are in their lower oxidation state such as those taken from the Group VIII elements (e.g. $Co^{2+}$, $Fe^{2+}$ and the like), $Ti^{3+}$, $V^{2+}$, $Nb^{3+}$, $Cr^{2+}$, $Mo^{2+}$, $W^{2+}$, $Mn^{2+}$, $Re^{2+}$, $Cu^{1+}$, $Au^{1+}$, $Hg^{1+}$, $Tl^{1+}$, $Sn^{2+}$, $Pb^{2+}$, $Sb^{3+}$, $Bi^{3+}$ and the like as well as mixtures thereof. The anions that are present with these cations will be the same as those set forth herein for the tin salt. The reducing agents are used in the amounts set forth herein, and especially from about 1 to about 20 parts, on a molar basis as set forth in formula (2-b) or from about 1 to about 60 g/l as set forth in formula (3-a).

The surfactants that may be employed comprise any non-ionic, anionic, cationic or amphoteric surfactant such as those listed in Kirk-Othmer, *Encyclopedia of Chemical Technology*, Third Edition, Volume 22, pp. 332–387, which is incorporated herein by reference. The non-ionic surfactants are especially preferred.

EXAMPLE 1

A coating composition was prepared comprising the following components:

| | |
|---|---|
| Thiourea | 60 g/l |
| Urea | 40 g/l |
| $H_2SO_4$ (36N; 98%) | 200 ml/l |
| $SnSO_4$ | 30 g/l |
| Triton x-100 | 3 ml/l |
| $Hg_2Cl_2$[1] | 1 g/l |
| $HNO_3$[1] (70%) | 10 ml/l |
| water | balance |

[1]$Hg_2Cl_2$ was dissolved in $HNO_3$ and combined with the other compounds of the composition.

The composition was selectively applied as an etch resist to the outer layer of a copper coated MLB having a positive working photo resist on it. A positive image was projected through the photo resist, after which it was developed leaving a bare metal surface corresponding to the circuit. The exposed bare metal areas were coated with tin by immersing the board in the coating composition for about 45 seconds at 30° C. to obtain a thin (approximately 0.13 micron) pore free tin coating on the copper. The photo resist was stripped away and the uncoated copper etched by means of an etchant comprising a solution of 200 ml of 50% sulfuric acid and 100 ml of 35% hydrogen peroxide. The etchant selectively dissolves the exposed copper while leaving the tin coating substantially intact. Art known equivalents of the etchant may be used with substantially the same results.

It has also been found that the undercutting of the tin layer is substantially minimized by employing the tin composition of the present invention especially where the substrate comprises a layer of electrolytic copper and/or electroless copper.

The etched layer of the MLB is then covered with a solder mask, without re-flowing the coating or levelling it by means of a hot air knife, the mask developed, circuit components placed in the MLB and soldered at 290° C. by means of a wave soldering process. The coating had very good solderability and the MLB was unaffected when exposed to these soldering conditions for 60 seconds. The solder mask did not shift nor were bubbles formed underneath it. Conventional electrolytically deposited tin alloy etch resists cannot stand up to these conditions for more than 10 to 20 seconds even after reflowing and levelling.

EXAMPLE 1A

The procedure of Example 1 was repeated using 50 g/l of an acrylic resin Acrysol WS-24 in addition to the other components of the composition and substantially the same results were obtained.

EXAMPLE 2

Insulation Resistance Process Contamination Test

This test is designed to measure the insulation resistance between two current carrying tracks separated by a base material on a delected test pattern which is exposed to damp heat in a prescribed test chamber. Measurements are taken initially before insertion in the test chamber and after 8 and 21 days in the chamber according to British Standard Specifications (BS9760 and BS9000) which call for a minimum resistance measurement at 500 volts and relative humidity of 500 of $10^8$ ohms for each of the three measurements. This test is designed to seek out any surface contamination produced in the manufacture of the board, which could lower the ability of the base material to act as an electrical insulator.

Four test panels were coated according to Example 1 and tested by the foregoing method. The relevant resistance measurements in ohms $\times 10^8$ were recorded as below for these panels.

| Identification | Initially | | After 8 Days | | After 21 Days | |
|---|---|---|---|---|---|---|
| British Standard | Min | 1.0 | Min | 1.0 | Min | 1.0 |
| Test Panel No. 1 | | 2.5 | | 20.0 | | 20.0 |
| Test Panel No. 2 | | 1.2 | | 7.0 | | 11.0 |
| Test Panel No. 3 | | 3.8 | | 8.5 | | 12.0 |

| Identification | Initially | After 8 Days | After 21 Days |
|---|---|---|---|
| Test Panel No. 4 | 0.8 | 7.5 | 25 |

These data illustrate that the tin immersion coating of the invention does not cause harmful surface contamination on a PCB and is also an indication that harmful dendritic tin growths or "whiskers" are not formed under the high humidity conditions of the test.

What is claimed is:

1. A process for manufacturing a device having a metal surface in which a portion of said metal surface is removed by etching comprising selectively applying an etch resist immersion composition to said metal surface to leave areas of coated and uncoated metal followed by etching said metal not coated with said etch resist, said etch resist comprising:
   (a) a thiourea compound
   (b) a urea compound
   (c) a metal salt.

2. The process of claim 1 where said etch resist composition further contains:
   (d) a chelating agent
   (e) a reducing agent
   (f) an acid.

3. The process of claim 1 where said metal salt comprises a tin salt and said composition optionally contains a member selected from the group consisting of a Group VIII metal salt, a Group IVA metal salt with the exception of tin, a Group IIB metal salt or a Group IB metal salt.

4. The process of claim 1 where said metal salt comprises a stannous salt.

5. The process of claim 2 where said reducing agent comprises an aldehyde reducing agent.

6. The process of claim 2 where said acid comprises a mineral acid and said tin salt comprises a stannous salt of a mineral acid.

7. The process of claim 1 where said thiourea compound and said urea compound comprise a thiourea nucleus and a urea nucleus with the same substituents on each of said nuclei.

8. The process of claim 7 where said thiourea compound comprises thiourea and said urea compound comprises urea.

9. The process of claim 4 where said etch resist further contains a compound selected from a member of the group consisting of a Group VIII metal salt, a Group IVA metal salt with the exception of tin, a Group IIB metal salt or a Group IB metal salt or mixtures thereof.

10. The process of claim 4 where said etch resist further contains a metal salt selected from a member of the group consisting of the salts of iron, cobalt, nickel, mercury or lead or mixtures thereof.

11. The process of claim 10 where said salt comprises a mercury salt.

12. The process of claim 4 further comprising a salt of lead.

13. The process of claim 1 or 2 or 9 further comprising a surfactant.

14. The process of claims 1 or 2 or 9 further comprising a polyoxyethylene nonyl phenol surfactant.

15. The process of claims 1 or 2 where the components of said composition are present in the following amounts on a molar basis:
   (a) about 10 to about 125 parts of a thiourea compound
   (b) about 10 to about 125 parts of urea compound
   (c) about 1 to about 15 parts of a metal salt.

16. The process of claim 15 further comprising the following components on a molar basis:
   (d) about 5 to about 40 parts of a chelating agent
   (e) about 5 to about 110 parts of a reducing agent
   (f) about 1 to about 30 parts of an acid.

17. The process of claim 15 where said metal salt comprises a tin salt.

18. The process of claim 17 where said etch resist further contains a compound selected from a member of the group consisting of a Group VIII metal salt, a Group IVA metal salt with the exception of tin, a Group IIB metal salt or a Group IB metal salt or mixtures thereof in an amount from about $2 > 10^{-6}$ parts to about 55 parts on a molar basis and said metal salt comprises a stannous salt.

19. The process of claim 4 where said metal surface comprises a metal layer and said device comprises a printed circuit board.

20. The process of claim 19 where said printed circuit board comprises a multilayer board.

21. The process of claim 19 where said printed circuit board comprises a single layer board.

22. The process of claim 19 comprising applying said etch resist to said metal layer through a photoresist layer on said metal layer, a circuit image having been projected onto the said photoresist and developed to selectively expose said metal layer.

23. The process of claims 19 or 20 or 21 or 22 further comprising applying a solder mask over said coated metal remaining on said electrical device after said etching step, developing said solder mask, inserting circuit components into said circuit and soldering said electrical device.

24. The process of claim 4 where said etch resist further contains a Group IIB metal salt.

25. The process of claim 17 where said etch resist further contains a Group IIB metal salt in an amount from about $2 \times 10^{-6}$ parts to about 55 parts on a molar basis.

26. The process of claims 24 or 25 where said Group IIB salt comprises a salt of mercury.

* * * * *

UNITED STATES PATENT AND TRADEMARK OFFICE
CERTIFICATE OF CORRECTION

PATENT NO. : 4,657,632

DATED : April 14, 1987

INVENTOR(S) : Abraham M. Holtzman, et al.

It is certified that error appears in the above-identified patent and that said Letters Patent is hereby corrected as shown below:

Column 2, line 30: "These circuits elements" should read --The circuit elements--

Column 2, line 48: "MLB array are placed" should read --MLB array and are placed--

Column 2, line 49: "175°C. held there" should read --175°C. and held there--

Column 2, line 64: "amonium persulfate;" should read --ammonium persulfate;--

Column 3, line 13: "amonium persulfate;" should read --ammonium persulfate;--

Column 3, line 57: "difficultly" should read --difficulty--

Column 5, line 59: "under there" should read --under these--

Column 7, line 11: "miilionths" should read --millionths--

Column 10, line 33: "quantitities" should read --quantities--

UNITED STATES PATENT AND TRADEMARK OFFICE
CERTIFICATE OF CORRECTION

PATENT NO. : 4,657,632
DATED : April 14, 1987
INVENTOR(S) : Abraham M. Holtzman, et al.

It is certified that error appears in the above-identified patent and that said Letters Patent is hereby corrected as shown below:

Column 15, line 21: "S-methylisothouronium" should read --S-methylisothiouronium--

Column 18, line 47: "on a delected" should read --on a selected--

Column 18, line 53: "500 of $108^8$ ohms" should read --500 at $10^8$ ohms--

Column 20, line 28: "$2 > 10^{-6}$" should read --$2 \times 10^{-6}$--

Signed and Sealed this

Tenth Day of November, 1987

Attest:

DONALD J. QUIGG

Attesting Officer

Commissioner of Patents and Trademarks